United States Patent
Choi et al.

(10) Patent No.: US 6,355,554 B1
(45) Date of Patent: Mar. 12, 2002

(54) METHODS OF FORMING FILLED INTERCONNECTIONS IN MICROELECTRONIC DEVICES

(75) Inventors: Gil-heyun Choi, Kyungki-do; Eung-joon Lee, Seoul; Byeong-jun Kim, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/482,584

(22) Filed: Jan. 13, 2000

Related U.S. Application Data

(63) Continuation-in-part of application No. 08/680,784, filed on Jul. 16, 1996, now abandoned.

(30) Foreign Application Priority Data

Jul. 20, 1995 (KR) .............................. 95-21395

(51) Int. Cl.[7] .......................................... H01L 21/4763
(52) U.S. Cl. ................... 438/632; 438/626; 438/640; 438/700
(58) Field of Search ................. 438/632, 626, 438/640, 645, 700, 952

(56) References Cited

U.S. PATENT DOCUMENTS

| | | | |
|---|---|---|---|
| 4,920,070 A | 4/1990 | Mukai | 438/173 |
| 4,997,790 A | 3/1991 | Woo et al. | 438/195 |
| 5,288,665 A | 2/1994 | Nulman | 438/194 |
| 5,364,817 A | 11/1994 | Lur et al. | 438/192 |
| 5,380,678 A | 1/1995 | Yu et al. | 438/190 |
| 5,436,188 A | 7/1995 | Chen | 438/52 |
| 5,464,794 A | 11/1995 | Lur et al. | 438/187 |
| 5,525,534 A | 6/1996 | Ikemasu et al. | 438/60 |
| 5,595,937 A | * 1/1997 | Mikagi | |
| 5,665,659 A | 9/1997 | Lee et al. | 438/646 |
| 6,060,385 A | * 5/2000 | Gzvens | |

* cited by examiner

Primary Examiner—Kevin M. Picardat
Assistant Examiner—D. M. Collins
(74) Attorney, Agent, or Firm—Myers Bigel Sibley & Sajovec

(57) ABSTRACT

Methods of fabricating an interconnection to an underlying microelectronic layer include removing a portion of the insulation layer to form a plurality of contact holes having different contact sizes therethrough and thereby expose a portion of the microelectronic layer. A conductive material is deposited on the insulation layer and in the contact hole with a sufficient thickness such that a bridge is generated in the largest contact hole. The deposited conductive material is then reflowed to fill the contact hole and form an interconnection to the underlying microelectronic layer, by supplying a high pressure such that at least the void formed in the largest contact hole is filled. The conductive material may be planarized to thereby expose the insulation layer. The present invention may be applied to an asymmetrical contact hole, for example, a dual damascene structure. In a large contact hole in which it is difficult to bridge the contact hole, a second insulation layer having a lower etch rate is formed on a first insulation layer having a higher etch rate when etched by an etchant. Portions of the first and second insulation layers are then removed to form a contact hole therethrough, leaving portions of the second insulation layer extending the first insulation layer at peripheral portions of the contact hole, overhang the exposed portion of the microelectronic layer.

32 Claims, 8 Drawing Sheets

METHODS OF FORMING FILLED INTERCONNECTIONS IN MICROELECTRONIC DEVICES

This is a continuation-in-part of U.S. patent application Ser. No. 08/680,784, filed Jul. 16, 1996 now abandoned, for METHODS OF FORMING FILLED INTERCONNECTIONS IN MICROELECTRONIC DEVICES, the disclosure of which is incorporated by reference herein in its entirety.

FIELD OF THE INVENTION

The present invention relates to microelectronic device fabrication methods, in particular, to methods for fabricating interconnections including a contact hole and an interconnection line in microelectronic devices.

BACKGROUND OF THE INVENTION

When forming an interconnection to a microelectronic layer of a microelectronic device, a contact hole typically is formed in an insulating layer covering the microelectronic layer, and the contact hole is filled with a conductive material to form an interconnection. Several techniques have been developed for filling contact holes, including widely-used selective tungsten, blanket tungsten, laser reflow, high temperature deposition, and aluminum reflow processes. As the density of the integration of microelectronic devices has increased, however, the cross-sectional area of contact holes used for interconnections has generally decreased, leading to a need to use contact holes having increased aspect ratio. It may be difficult to fill such high aspect ratio contact holes using conventional techniques.

Long throw sputtering (LTS) and high-pressure reflow processes have been developed for filling high aspect ratio contact holes. In the LTS process, improved step coverage, and thus improved contact hole filling capability, may be achieved by increasing the distance between a target and a wafer to be processed for improving an initial step coverage of the contact hole. However, a void may be formed due to reduced deposition speed of the sputtered conductive material and asymmetry between the edge and the center of the contact hole where the conductive material is deposited. Such problems may make it difficult to fill a contact hole having an aspect ratio of 4 or greater.

High-pressure reflow processes typically involve deposition of aluminum on a contact hole, and subsequent treatment under high temperature and pressure, for example, 400° C. and 600 MPa, to reflow the deposited material into the contact hole. However, although the conventional high temperature reflow processes may be effective for filling contact holes having an aspect ratio of 10 or greater, they may not be effective for filling large diameter contact holes.

FIGS. 1A and 1B are cross-sectional views illustrating conventional techniques of forming an interconnection according to the prior art. Referring to FIGS. 1A and 1B, a contact hole is formed in an insulating layer 12 on a microelectronic substrate 10 using, for example, a photolithography process. The contact hole is then cleaned using a hydrogen fluoride, and a barrier layer 14 and an aluminum layer 16 are deposited on the resultant structure. The deposited aluminum is then reflowed by applying high temperature and pressure, for example, 400° C. and 600 MP, which causes the deposited aluminum to fill the contact hole as illustrated in FIG. 1B.

As described above, although the conventional high temperature reflow processes may be effective for filling contact holes having an aspect ratio of 10 or greater, it may not be effective for filling large diameter contact holes. That is, if there is a failure to bridge a large contact hole, this may lead to the generation of a void A in the contact hole during the reflow process as shown in FIG. 1B. In addition, if there are a plurality of contact holes having different contact sizes in the same layer, it is more difficult to fill the contact holes without the generation of voids.

FIGS. 5A to 5C are cross-sectional views illustrating a conventional aluminum reflow technique for forming an interconnection when a plurality of contact holes having different contact sizes are formed in the same insulation layer. Referring to FIG. 5A, an insulation layer 62 is formed on a substrate 60 having a planarized surface. A plurality of contact holes 64a and 64b are formed in the insulation layer 62 by a general photolithography technique. The contact hole 64a has a contact diameter of "a" and the other contact hole 64b has a contact diameter of "b" which is larger than a contact size of "a". Then, an aluminum layer 66 is deposited on the exposed surface of the substrate 60 and the insulation layer 62 with a thickness of "T1".

Referring to FIG. 5B, a conventional aluminum reflow process is performed on the resultant structure of FIG. 5A by supplying heat. At this time, the aluminum layer 66 is flowed into the plurality of contact holes 64a and 64b, but the relatively small contact hole 64a may include a void 67 and the relatively large contact hole 64b may be not fully filled with the aluminum.

Referring to FIG. 5C, a Chemical-Mechanical Polishing (CMP) process is performed on the resultant structure for planarization, to expose the insulation layer 62. At this time, although the surface of the small contact hole 64a is planarized, the large contact hole 64b is not sufficiently planarized.

In the meantime, in the above aluminum reflow process, if the thickness T1 of the deposited aluminum is controlled on the basis of the large contact hole 64b, the thickness of the aluminum layer to be deposited is increased, to thereby bridge the aluminum layer 66 at the upper portion of the small contact hole 64a. Therefore, in a subsequent reflow process, a void is formed in the small contact hole 64a. This void also acts as a factor of deterioration of device.

For multi-layered microelectronic devices, the aspect ratio of contact holes may be even further increased, causing problems such as a non-planarization of interconnection layers, inferior step coverage, metal shorts, low yields, and reduced reliability. In order to address many of these problems, damascene techniques have been developed.

FIG. 2 is a cross-sectional view of a conventional dual damascene structure. The dual damascene structure includes a stud (contact hole) connected to the underlying substrate 10 and an interconnection line with a predetermined depth in the insulation layer 12. If the stud is located apart from a center of the interconnection line, the dual damascene structure has substantially asymmetrical characteristics for filling with a material. In the meanwhile, if the stud is located in a center of the interconnection lines, the dual damascene structure has also asymmetrical characteristics for filling due to the differences of width and depth between the stud and the interconnection lines. These damascene techniques typically involve etching a planar insulating layer to form a via, filling the via with metal 18, and removing excessive metal overlying the insulating layer using chemical mechanical polishing (CMP). Sputtered aluminum or tungsten deposited by chemical vapor deposition (CVD) are commonly used as the filling metal.

For CVD-deposited tungsten, a titanium nitride layer may be used as an adhesion layer, and the adhesion layer lifted by tungsten fluoride ($WF_6$) gas. However, during planarization using CMP, a defect may be formed in the metal fill due to a seam which is typically formed during chemical vapor deposition of tungsten. For sputtered aluminum, the contact hole may not be fully filled due to an inferiority of step coverage, typical of the sputtering process. This may resulting in the formation of a void B, as illustrated in FIG. 2.

SUMMARY OF THE INVENTION

In light of the foregoing, it is an object of the present invention to provide improved methods for forming interconnections including a contact hole and an interconnection line in microelectronic devices which reduce the probability of voids and other defects.

It is another object of the present invention to provide methods for forming an interconnections in microelectronic devices which are suitable for use with large contact holes.

It is still another object of the present invention to provide methods for forming a contact holes in microelectronic devices which are suitable for use with a plurality of contact holes having a different contact size.

It is yet still another object of the present invention to provide methods for forming interconnection lines in microelectronic devices which are suitable for use with a plurality of interconnection lines having a different widths.

It is yet still another object of the present invention to provide methods for forming interconnections including a stud and an interconnection line in microelectronic devices which are suitable for use with an asymmetrical characteristic for filling.

These and other objects features and advantage are provided according to a first aspect of the present invention by methods for forming an interconnection to a microelectronic layer in which a plurality of contact holes are formed through an insulation layer covering the microelectronic layer, wherein at least one contact hole out of the contact holes has a different contact size from the others. Then, conductive material is formed on the insulation layer and in the contact holes to a predetermined thickness such that the conductive material bridges a largest contact hole of the contact holes at the upper side of the largest contact hole, forming a void therein. After this, the conductive material is reflowed to thereby fill the contact holes, by supplying a high pressure such that at least the void formed in the largest contact hole is filled, and to form an interconnecting conductive region extending from the surface of the insulation layer to the microelectronic layer.

Preferably, a step of forming a barrier metal layer on the exposed surface of the contact holes is performed before the step of forming the conductive material. A step of planarizing the reflowed conductive material to remove the conductive material overlying the surface of the insulation layer is preferably performed, after the step of reflowing the conductive material to thereby expose the insulation layer.

According to a second aspect of the present invention, a method of fabricating an interconnection to an underlying microelectronic layer includes removing a portion of the insulation layer to form at least one asymmetrical structure therethrough and thereby expose a portion of the underlying microelectronic layer, wherein the asymmetrical structure has an asymmetrical characteristics for filling a subsequent conductive material. Then, a conductive material is formed on the insulation layer and in the asymmetrical structure with a predetermined thickness such that at least the conductive material bridges the asymmetrical structure at the upper end of the structure. The conductive material is then reflowed to thereby fill the asymmetrical structures, by supplying a high pressure such that voids formed in the asymmetrical structure disappear.

Preferably, the asymmetrical contact hole is a dual damascene structure which is a combination of an interconnection line with a predetermined depth in the insulation layer and a stud, which is overlapped by the interconnection line and connected to the underlying microelectronic layer.

According to a third aspect of the present invention, a method of fabricating an interconnection to a microelectronic layer in a substrate includes forming a first insulation layer on the substrate, covering the microelectronic layer, the first insulation layer having a surface opposite the microelectronic layer. A second insulation layer is formed on the substrate, covering the first insulation layer. Portions of the first and second insulation layers are then removed to form a contact hole therethrough and expose a portion of the microelectronic layer, leaving portions of the second insulation layer extending past the first insulation layer at peripheral portions of the contact hole, overhanging the exposed portion of the microelectronic layer. A conductive material is deposited on the substrate, bridging the contact hole at the portions of the second insulation layer extending past the first insulation layer. The deposited conductive material is then reflowed to thereby fill the contact hole, by supplying a high pressure such that a void formed in the contact hole is filled, forming a conductive region extending from the surface of the first insulation layer to the microelectronic layer.

Preferably, the first insulation layer and the second insulation layers have first and second etching rates, respectively, with respect to an etchant, the second etching rate preferably being less than the first etching rate. The contact hole preferably is formed by etching with the etchant to leave portions of the second insulation extending past the first insulation layer at peripheral portions of the contact hole, overhanging the exposed portion of the microelectronic layer. For example, the etchant may be hydrogen fluoride, the first insulation layer may include one of borophosphosilicate glass (BSPG) and undoped silicate glass (USG), and the second insulation layer may include one of silicon nitride and plasma-enhanced silane.

Prior to formation of the contact hole, a third insulation layer may be formed on second insulation layer. Then, portions of the first, second and third insulation layers may be removed to form a contact hole therethrough, exposing a portion of the active layer, and to leave portions of the second insulation layer extending past the first insulation layer at peripheral portions of the contact hole, overhanging the exposed portion of the microelectronic layer. The third insulation layer may be formed from the same type of material as the first insulation layer, and preferably is thinner than the first insulation layer.

The conductive material preferably includes one of aluminum or aluminum alloy, and the deposition preferably occurs by sputtering or Chemical Vapor Deposition method. Prior to depositing the conductive material, a barrier metal layer may be formed on the substrate, the barrier metal layer preferably including one of titanium and titanium nitride. Improved methods of forming interconnections are thereby provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF EMBODIMENTS

Figure 1A:
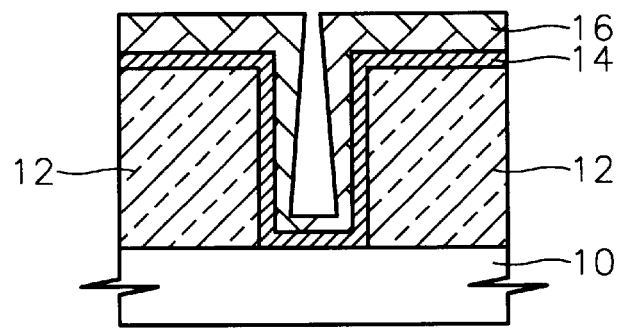
FIGS. 1A and 1B are cross-sectional views illustrating conventional techniques forming an interconnection according to the prior art.
Figure 1B:
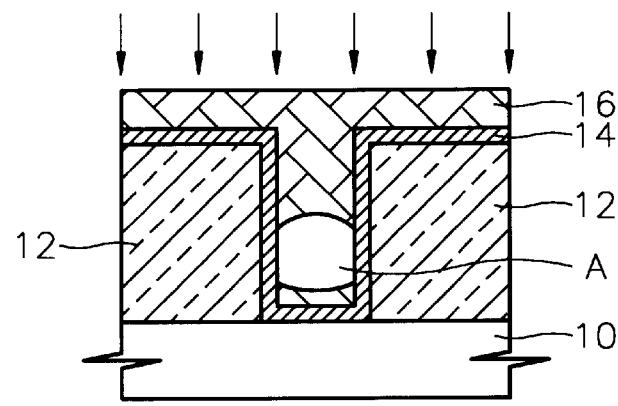
Figure 2:
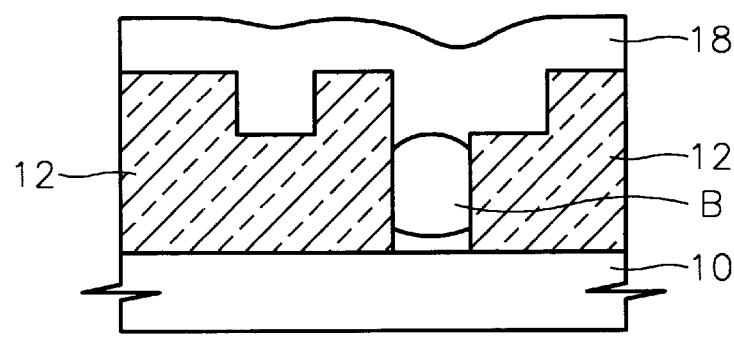
FIG. 2 is a cross-sectional view illustrating conventional dual damascene structure.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 6A:
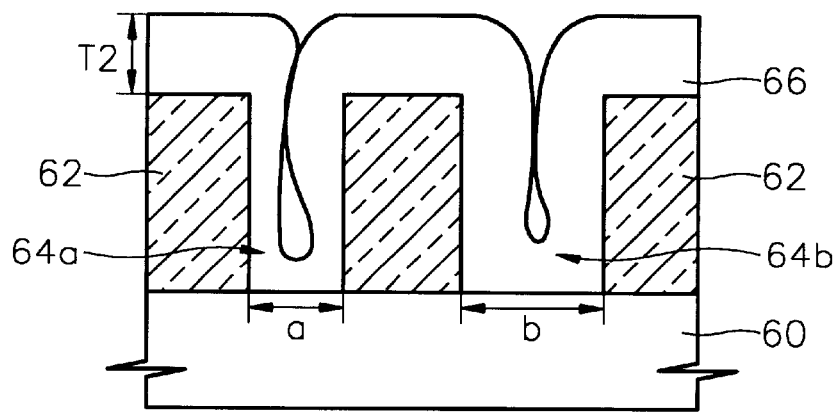
FIGS. 6A and 6C are cross-sectional views illustrating a method for forming interconnection lines in a plurality of contact holes having different contact sizes according to a first aspect of the present invention.
Figure 6B:
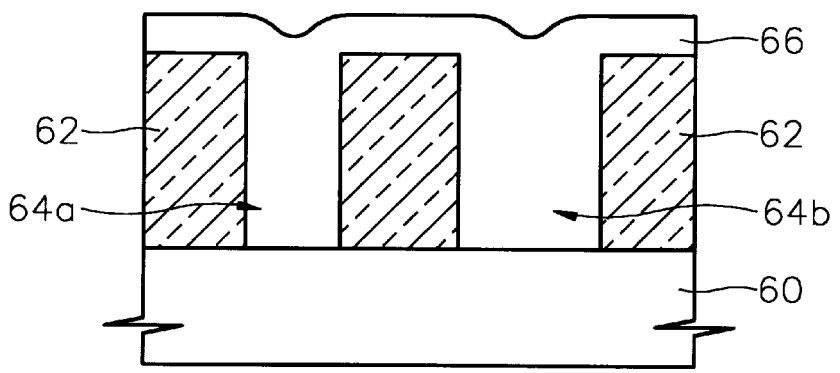
FIG. 6D is a perspective view of the interconnection line structure of FIG. 6C not showing an interconnection material.
Figure 6C:
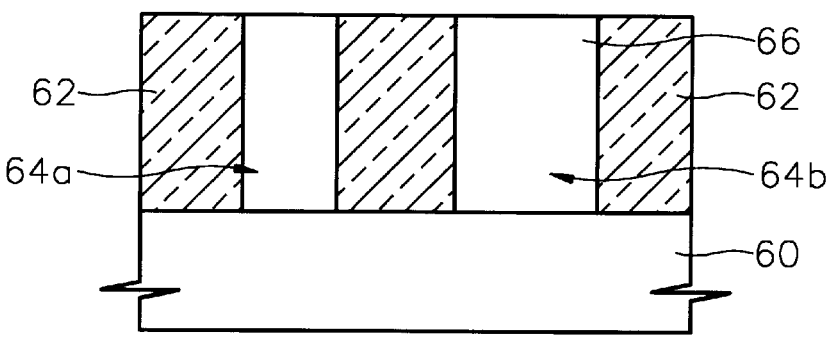
Figure 6D:
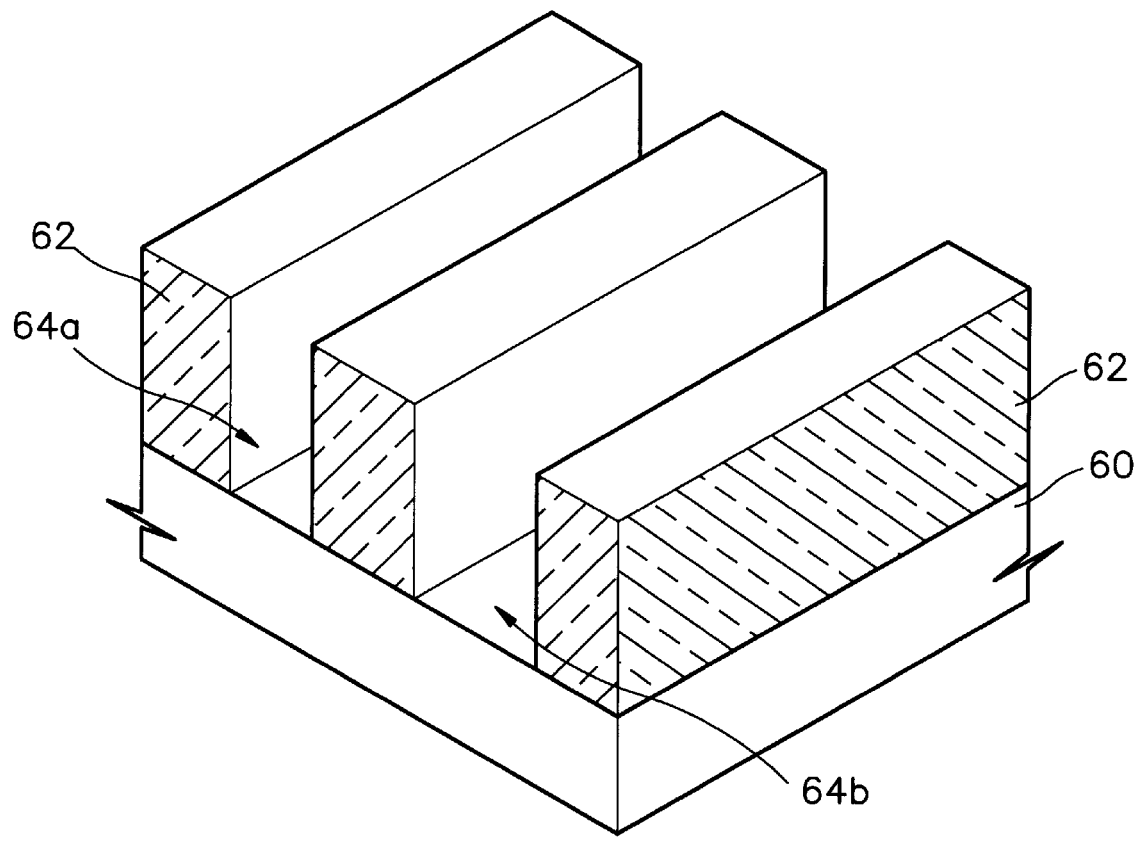

FIG. 6A to 6C are cross-sectional views illustrating a method for forming interconnection lines when a plurality of interconnection lines having different width are formed in the same insulation layer, according to a first aspect of the present invention. FIG. 6D is a perspective view of the interconnection lines structure of FIG. 6C not showing an interconnection material. Even though FIGS. 6A to 6D illustrates a method for forming a plurality of interconnection lines having different width, the present invention also is applicable to a method for forming a plurality of contact holes having different contact size.

Referring to FIG. 6A, an insulation layer 62 is formed on a substrate 60 having a planarized surface. The substrate 60 may be a semiconductor substrate or other underlying layer. A plurality of interconnection line regions 64a and 64b are formed in the insulation layer 62 by a general photolithography technique. The interconnection line 64a has a line width of "a" and the other interconnection line 64b has a line width of "b" which is larger than the width of "a". Then, a conductive material, such as aluminum or aluminum alloy layer 66, is deposited on the exposed surface of the substrate 60 and the insulation layer 62 with a thickness of "T2" by a sputtering method at room temperature or greater or a conventional Chemical Vapor Deposition(CVD) method.

At this time, the thickness T2 of aluminum layer 66 is controlled to bridge at the upper portion of the large interconnection line 64b. Namely, the thickness T2 of the aluminum layer 66 to be deposited is greater than or equal to half of the large line width of the interconnection line 64b "½ b". Therefore, since the aluminum layer 66 is sufficiently deposited on the large interconnection line 64b to bridge at the upper side of the interconnection line 64b and form a void in the interconnection line, bridges are formed in all of the other smaller interconnection lines (not shown) including the small interconnection line 64a. A barrier metal layer (not shown) can be formed to a thickness of approximately 500Å on the exposed surface of the contact holes before forming aluminum layer. The barrier metal layer may be composed of one of a titanium layer and a titanium nitride layer.

Referring to FIG. 6B, a high temperature and high-pressure aluminum reflow process is performed on the resultant structure of FIG. 6A. The reflow process is preferably performed at a temperature of approximately 400° C. or greater and at a pressure of approximately 600 MPa or greater for aluminum or aluminum alloy. The interconnection lines, including the large interconnection line 64b, are filled with the aluminum layer 66 over the interconnection line regions, and all of the voids formed in the interconnection lines preferably are filled.

Figure 5A:
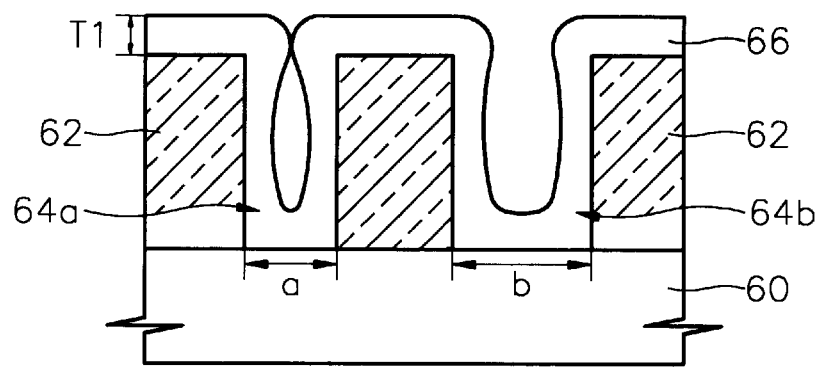
FIGS. 5A and 5C are cross-sectional views illustrating a conventional method for forming interconnections in a plurality of contact holes having different contact sizes.
Figure 5B:
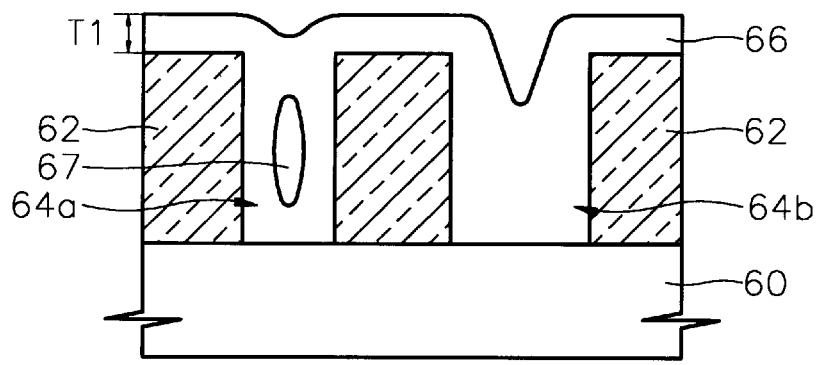
Figure 5C:
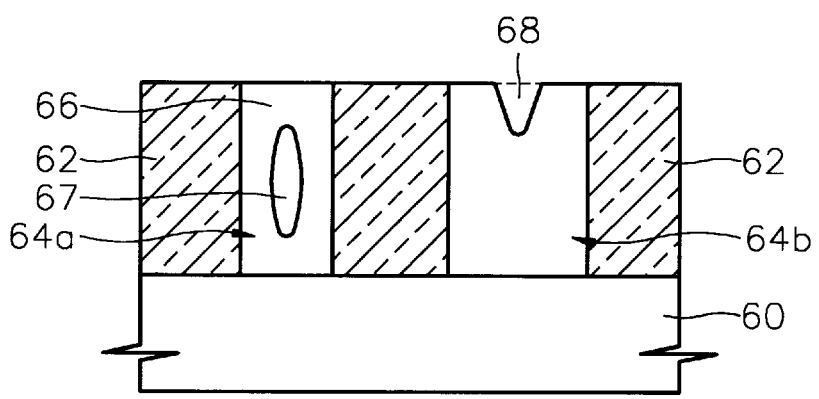

Referring to FIG. 6C, a Chemical-Mechanical Polishing (CMP) process is performed on the resultant structure of FIG. 6B for planarization, exposing the insulation layer 62. Thus, according to this method, in contrast to the conventional structure as shown in FIG. 5C, the surfaces of all the interconnection lines can be filled and planarized.

In the meantime, in FIG. 6A, the insulation layer 62 may be composed of at least two different insulation layers having different etch rates. A first insulation layer having a lower etch rate is formed on a second insulation layer having an higher etch rate than that of the first insulation layer. The step of removing a portion of the insulation layer may include a step of etching with an etchant to form the interconnection lines and leave portions of the first insulation layer extending past the second insulation layer at each side portions of the interconnection lines, overhanging the exposed portion of the microelectronic layer, in order to easily bridge the aluminum layer at the protrusion of the first insulation layer during a subsequent deposition process.

In detail, the first insulation layer has an etching rate less than that of the second insulation layer with respect to the etchant used to form the interconnection line. For example, if the etchant is hydrogen fluoride, the second insulation layer may be boron-phosphorus silicate (BPSG) or undoped silicate glass (USG), and the first insulation layer may be silicon nitride (SiN) or plasma enhanced-silane (PE-SiH$_4$) having a thickness of 200 Å or more. Plasma-enhanced silane has an etching rate of about 260~600 Å/45 seconds and BPSG has an etching rate of about 2,300~2,500 Å/45 seconds for temperatures within a range of approximately 200° C. to approximately 400° C.

FIGS. 3A to 3E are cross-sectional views illustrating an intermediate fabrication method for forming an interconnection in a dual damascene structure according to a second aspect of the present invention. FIG. 3F is a perspective view of the dual damascene structure of FIG. 3E without interconnection material present.

According to a second aspect of the present invention, a stud as a contact hole and an interconnection line are formed through an insulation layer to an underlying microelectronic layer, conductive material is deposited onto the resultant structure, and the conductive material reflowed to fill the contact hole and the interconnection lines at a high temperature and high pressure conditions. The resulting structure may be planarized to remove the reflowed material overlying the insulation layer.

Figure 3A:
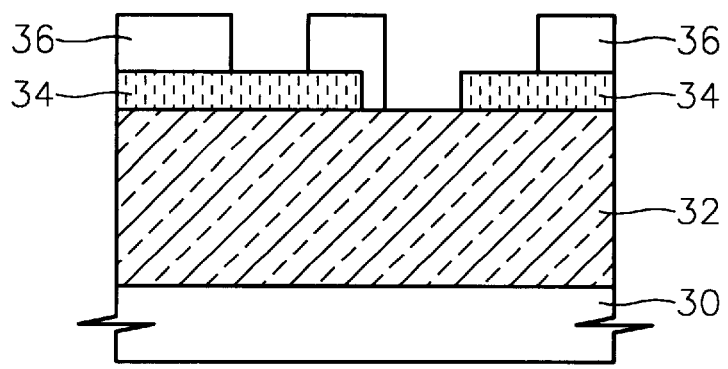
FIGS. 3A to 3E are cross-sectional views illustrating an intermediate fabrication method for forming an interconnection in a dual damascene structure according to a second aspect of the present invention.

As illustrated in FIG. 3A, a first mask layer 34 and a second mask layer 36 may be formed on an insulation layer 32 on a microelectronic layer 30. As illustrated, the first mask layer 34 is formed from a photoresist layer and patterned in first mask layer 34 for forming a contact hole for a stud. A second photoresist layer is formed on the first mask layer 34, and patterned to form second mask layer 36 for forming an interconnection line.

Figure 3B:
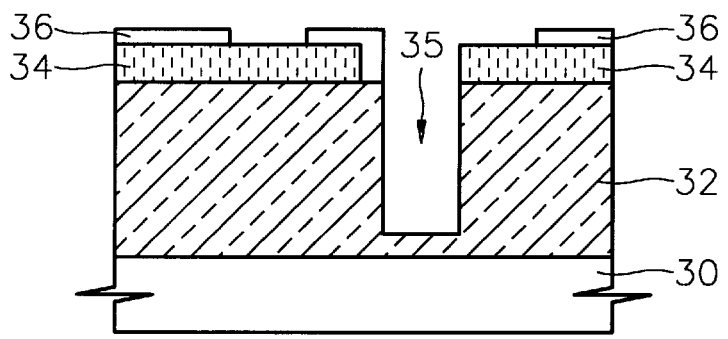

As illustrated in FIG. 3B, a portion of the insulation layer 32 is removed to form a contact hole through the insulation layer 32 and expose a portion of the underlying microelectronic layer 30. For the illustrated embodiment, the first mask layer 34 is partially etched using the second mask layer 36 as a mask to form a location for a stud, and then a contact hole 35 is etched through the insulation layer 32 for an interconnection to the microelectronic layer 30.

Figure 3C:
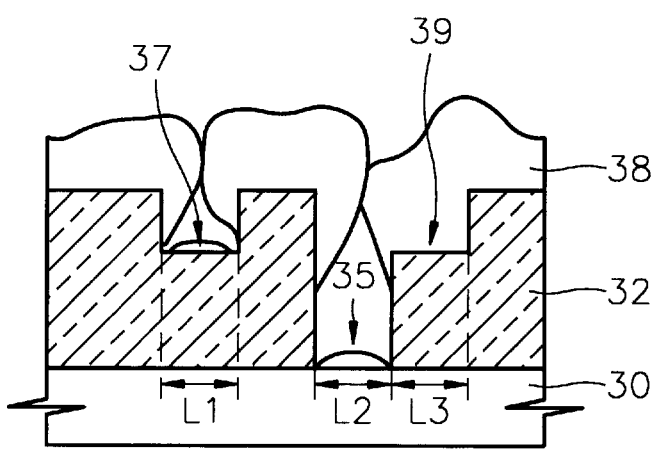

As illustrated in FIG. 3C, the etching process proceeds to expose the underlying microelectronic layer 30, thereby forming a contact hole 35 having a contact size of "L2" and interconnection lines 37 and 39 having bottom sizes of "L1" and "L3", respectively. In a dual damascene structure, the contact hole 35 for a stud and a portion of the interconnection line 39 are overlapped so that the contact hole 35 has an asymmetrical shape on the upper portion thereof from center to edge. The first and second mask layers 34, 36 are then removed, and a conductive material 38, preferably aluminum or aluminum alloy, is deposited on the resultant structure at the contact hole 35 by sputtering, preferably at room temperature or higher. Preferably, the conductive material 38 is deposited to a thickness sufficient to cause the conductive material 38 to bridge the asymmetrical structure including the contact hole 35 and the interconnection line 39.

Figure 3D:
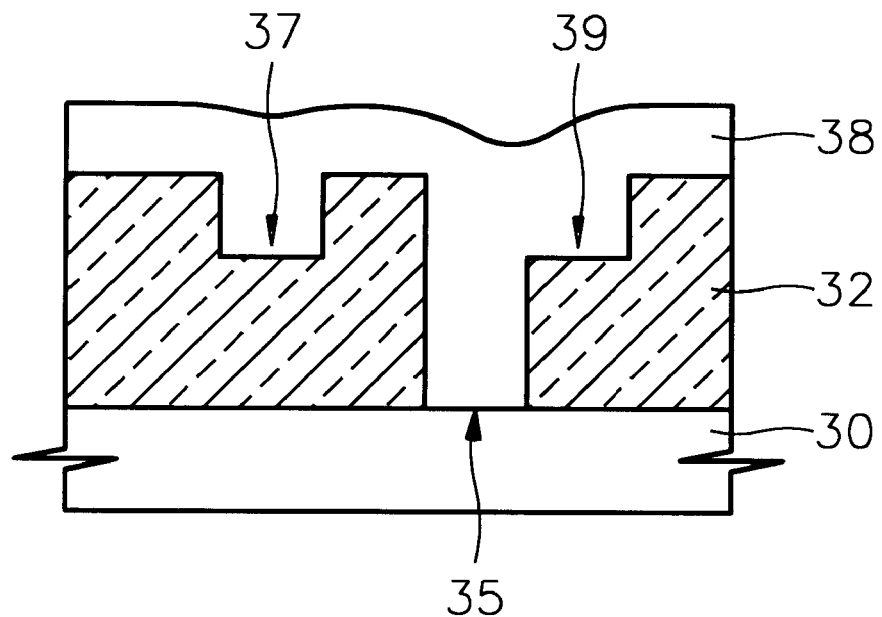
Figure 3E:
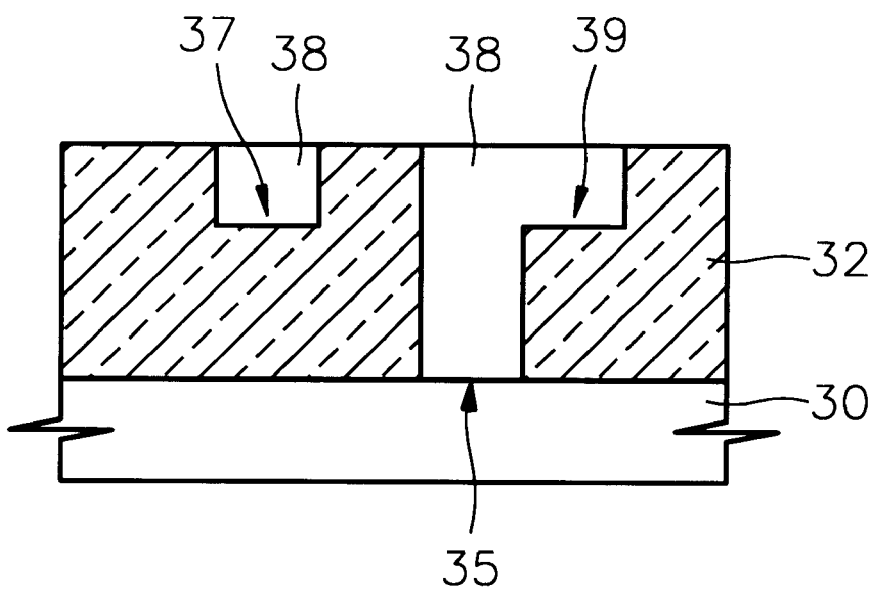
Figure 3F:
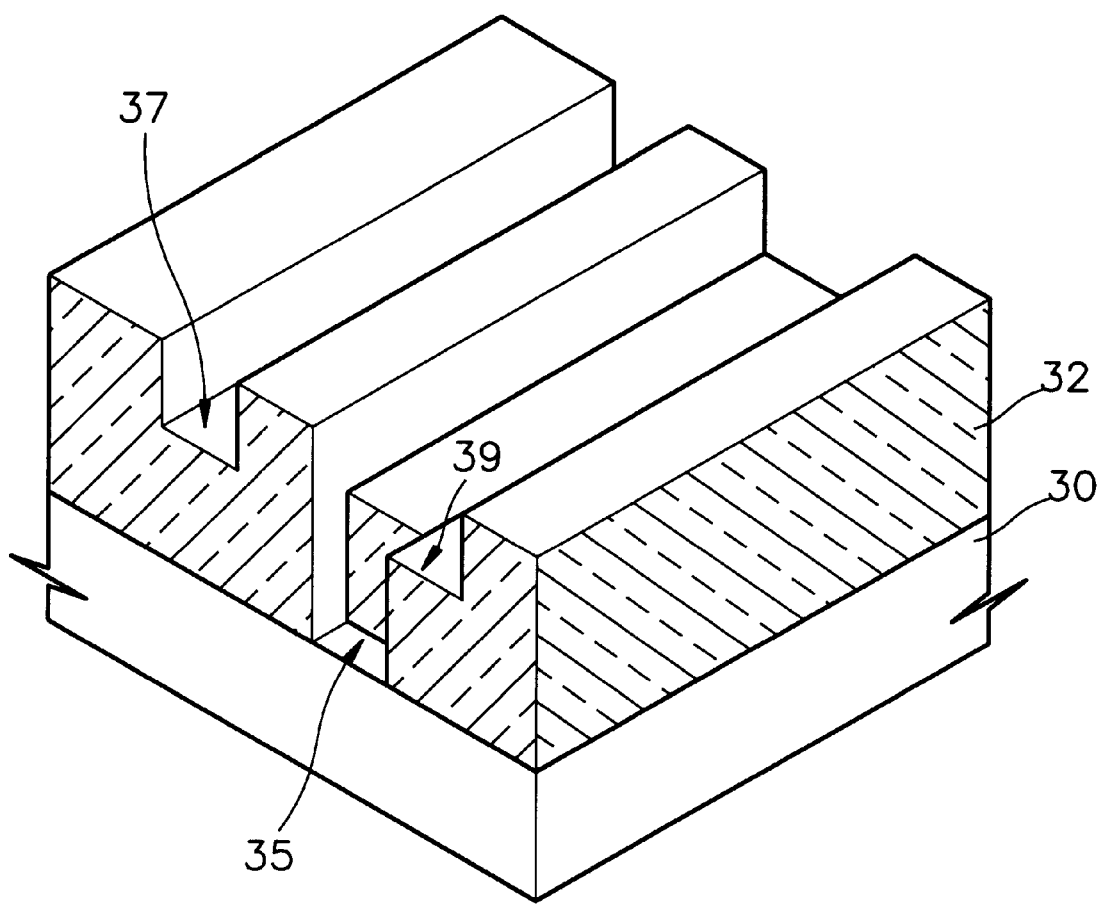
FIG. 3F is a perspective view of the dual damascene structure of FIG. 3E not showing an interconnection material for a stud and an interconnection line.

As illustrated in FIG. 3D, the structure is then subjected to high temperature and pressure, preferably 400° C. or greater and 600 MPa or greater, to reflow the deposited material and thereby fill the contact hole 35 and the interconnection lines 37 and 39 with the deposited conductive material 38. The structure is then planarized to remove the conductive material 38 overlying the insulation layer 32, preferably using a CMP process, as illustrated in FIG. 3E.

Figure 4A:
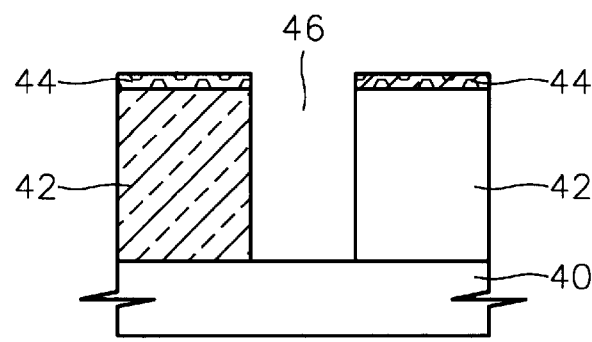
FIGS. 4A and 4D are cross-sectional views illustrating a method for forming an interconnection for large contact hole according to a third aspect of the present invention.
Figure 4B:
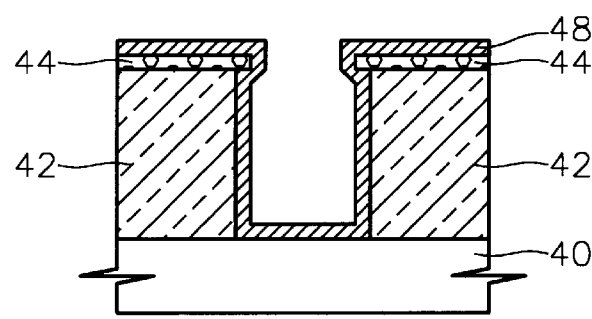
Figure 4C:
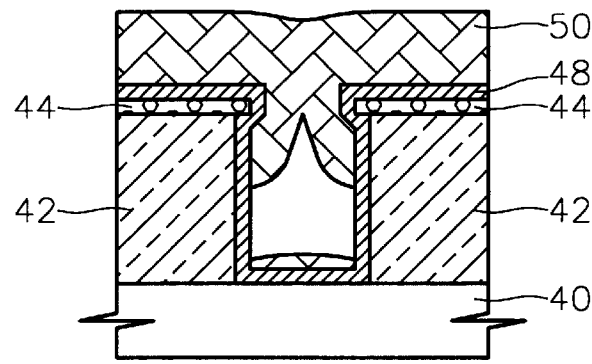
Figure 4D:
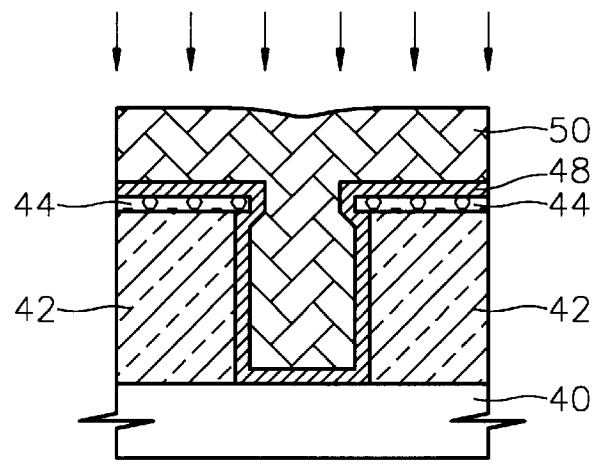

FIGS. 4A and 4D are cross-sectional views illustrating a method for forming an interconnection for a large contact hole having a size greater than a critical contact size for which it is difficult to generate a bridge, according to a third aspect of the present invention. As illustrated in FIG. 4A, a first insulation layer 42 is formed on a microelectronic layer 40, and a second insulation layer 44 is formed on the first insulation layer 42. A photoresist layer is formed on the second insulation layer 44 and patterned to expose a portion of the second insulation layer 44, and the first and second insulation layers 42, 44 are then etched using the photoresist layer pattern as a mask to thereby form the contact hole 46 having a contact size of "L4".

The second insulation layer 44 preferably has an etching rate less than that of the first insulation layer 42 with respect to the etchant used to form the contact hole 46. For example, if the etchant is hydrogen fluoride, the first insulation layer 42 may be boron-phosphorus silicate (BPSG) or undoped silicate glass (USG), and the second insulation layer 44 may be silicon nitride (SiN) or plasma enhanced-silane (PE-SiH$_4$) having a thickness of 200 Å or more. As those skilled in the art will understand, plasma-enhanced silane has an etching rate of about 260~600 Å/45 sec and BPSG has an etching rate of about 2,300~2,500 Å/45 sec for temperatures within a range of approximately 200° C. to approximately 400° C.

Additional layers having different etching rates than the second insulation layer 44 may also be formed on the second insulation layer 44. For example, a third insulation layer formed of the same material as the first insulation layer 42 may be deposited on the second insulation layer 44. Preferably, the thickness of the third insulation layer is less than that of the first insulation layer 42.

As illustrated in FIG. 4B, as the second insulation layer 44 has a lower etching rate than that of the first insulation layer 42, the first insulation layer 42 is more quickly etched than the second insulation layer 44, causing portions of the second insulation layer to extend past the first insulation layer 42 at peripheral portions of the contact hole 46, overhanging the exposed portion of the microelectronic layer 40. Therefore, the contact size of the contact hole 46 is increased from "L4" to "L5".

A barrier metal layer 48 may be formed on the structure, as illustrated in FIG. 4B, preferably by depositing titanium (Ti) or titanium nitride (TiN) to a thickness of approximately 500 Å. As illustrated in FIG. 4C, a conductive material 50 such as aluminum or aluminum alloy is deposited on the structure by, for example, sputtering at a room temperature or CVD method. The conductive material 50 preferably is deposited to a thickness sufficient to bridge the contact hole 46, for example, a thickness of 2,000 Å or more. In the deposition process, the overhang of the second insulation layer 44 helps reduce the cross-section of the contact hole 46 at its upper portions, to facilitate the formation of a bridge 49 of conductive material near upper portions of a contact hole 46.

As illustrated in FIG. 4D, the conductive material 50 may then be reflowed under high temperature and pressure to fill the contact hole 46. Thus, according to this aspect of the present invention, a large contact hole may be bridged with conductive material when it might otherwise be difficult to form a bridge using conventional techniques. The contact hole then may be more easily filled without the creation of voids. This third aspect of the present invention preferably is used to fill a contact hole having a bottom width of 0.7 micrometers or less and an aspect ratio equal to or more than 2.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating an interconnection to an underlying microelectronic layer, the underlying microelectronic layer covered by an insulation layer having a surface opposite the underlying microelectronic layer, the method comprising the steps of:

removing a portion of the insulation layer to form a plurality of contact holes therethrough and thereby expose a portion of the underlying microelectronic layer, wherein at least one contact hole of said contact holes has a different contact size than the other contact holes;

forming a conductive material on the insulation layer and in the contact holes to a predetermined thickness, such that the conductive material bridges a largest contact hole of the contact holes at the upper side of the largest contact hole forming a void therein; and reflowing the conductive material to thereby fill the contact holes by supplying a high pressure such that at least the void formed in the largest contact hole is filled.

2. A method according to claim 1, further comprising a step of forming a barrier metal layer on the exposed surface of the contact holes before said step of forming a conductive material.

3. A method according to claim 1, wherein said step of reflowing is followed by the step of planarizing the reflowed conductive material to remove conductive material overlying the surface of the insulation layer and thereby expose the insulation layer.

4. A method according to claim 1, wherein said step of forming the conductive material is performed by a Chemical Vapor Deposition(CVD) method.

5. A method according to claim 1, wherein the conductive material comprises at least one of aluminum and aluminum alloy.

6. A method according to claim 5, wherein said step of forming the conductive material is performed by sputtering method at room temperature or greater.

7. A method according to claim 5, wherein said step of reflowing comprises the step of reflowing at a temperature of approximately 400□ C. or greater and at a pressure of approximately 600 MPa or greater.

8. A method according to claim 1, wherein the insulation layer is composed of at least two different insulation layers having different etch rates and at least one of a first insulation layer having a lower etch rate is formed on a second insulation layer having an higher etch rate than that of the first insulation layer, wherein said step of removing a portion of the insulation layer comprises a step of etching with an etchant to form the contact holes and leave portions of the first insulation layer extending past the second insulation layer at peripheral portions of the contact holes, overhanging the exposed portion of the microelectronic layer.

9. A method of fabricating an interconnection to an underlying microelectronic layer, the underlying microelectronic layer covered by an insulation layer having a surface opposite the underlying microelectronic layer, the method comprising the steps of:

removing a portion of the insulation layer to form at least one asymmetrical structure therethrough and thereby expose a portion of the underlying microelectronic layer, wherein the shape of said asymmetrical structure has an asymmetrical characteristic for filling therein with a subsequent conductive material;

forming a conductive material on the insulation layer and in the asymmetrical structure with a predetermined thickness such that the conductive material bridges the asymmetrical structure at the upper end of the asymmetrical structure forming a void therein; and reflowing the conductive material to thereby fill the asymmetrical structure, by supplying a high pressure such that the void formed in the asymmetrical structure is filled.

10. A method according to claim 9, wherein said asymmetrical structure is a dual damascene structure which is a combination of an interconnection line, which is buried with a predetermined depth in the insulation layer and, a stud overlapped with the interconnection line and connected to the underlying microelectronic layer.

11. A method according to claim 10, wherein at least one other interconnection line with the same depth as the interconnection line of the damascene structure is formed in said step of removing the insulation layer.

12. A method according to claim 9, wherein said step of reflowing is followed by the step of planarizing the reflowed conductive material to remove conductive material overlying the surface of the insulation layer and thereby expose the insulation layer.

13. A method according to claim 9, wherein the conductive material comprises at least one of aluminum and aluminum alloy.

14. A method according to claim 13, wherein said step of forming the conductive material is performed by sputtering method at room temperature or greater.

15. A method according to claim 14, wherein said step of reflowing comprises the step of reflowing at a temperature of approximately 400° C. or greater and at a pressure of approximately 600 MPa or greater.

16. A method of fabricating an interconnection to a microelectronic layer in a substrate, the method comprising the steps of:

forming a first insulation layer on the substrate, covering the microelectronic layer, the first insulation layer having a surface opposite the microelectronic layer:

forming a second insulation layer on the substrate, covering the first insulation layer;

removing portions of the first and second insulation layers to form a contact hole therethrough and expose a portion of the microelectronic layer, leaving portions of the second insulation layer extending past the first insulation layer at peripheral portions of the contact hole, overhanging the exposed portion of the microelectronic layer;

depositing a conductive material on the substrate, bridging the contact hole at the portions of the second insulation layer extending past the first insulation layer forming a void in the contact hole; and reflowing the deposited conductive material to thereby fill the contact hole, by supplying a high pressure such that the void formed in the contact hole is filled.

17. A method according to claim 16:

wherein said step of forming a first insulation layer comprises the step of forming a first insulation layer having a first etching rate with respect to an etchant;

wherein said step of forming a second insulation layer comprises the step of forming a second insulation layer having a second etching rate less than the first etching rate with respect to the etchant; and wherein said step of removing comprises the step of etching with the etchant to form the contact hole and leave portions of the second insulation extending past the first insulation layer at peripheral portions of the contact hole, overhanging the exposed portion of the microelectronic layer.

18. A method according to claim 16:

wherein said step of forming a first insulation layer comprises the step of forming one of a borophosphosilicate glass (BSPG) layer and an undoped silicate glass (USG) layer;

wherein said step of forming a second insulation layer comprises the step of forming one of a silicon nitride layer and a plasma-enhanced silane layer; and wherein said step of etching comprises the step of etching with a hydrogen fluoride etchant.

19. A method according to claim 16:

wherein said step of removing is preceded by the step of forming a third insulation layer on the second insulation layer; and wherein said step of removing comprises the step of removing portions of the first, second and third insulation layers to form a contact hole therethrough, exposing a portion of the microelectronic layer, and to leave portions of the second insulation layer extending past the first insulation layer at peripheral portions of the contact hole, overhanging the exposed portion of the microelectronic layer.

20. A method according to claim 19:
wherein said third insulation layer is the same material as the first insulation layer.

21. A method according to claim 16, further comprising a step of forming a barrier metal layer on the exposed surface of the contact hole before said step of forming a conductive material.

22. A method according to claim 21 wherein said step of forming a barrier metal layer comprises the step of forming one of a titanium layer and a titanium nitride layer.

23. A method according to claim 16, wherein said step of depositing the conductive material is performed by a Chemical Vapor Deposition (CVD) method.

24. A method according to claim 16, wherein said step of depositing the conductive material is performed by a sputtering method at room temperature or greater.

25. A method according to claim 16 wherein the conductive material comprises at least one of aluminum and aluminum alloy.

26. A method according to claim 25 wherein said step of reflowing comprises the step of reflowing at a temperature of approximately 400☐ C. or greater and at a pressure of approximately 600 MPa or greater.

27. A method of fabricating an interconnection to an underlying microelectronic layer, the underlying microelectronic layer covered by an insulation layer having a surface opposite the underlying microelectronic layer, the method comprising the steps of:

removing a portion of the insulation layer to form a plurality of interconnection line regions, wherein at least one interconnection line region out of said interconnection line regions has a different width from the other interconnection line region;

forming a conductive material on the insulation layer and in the interconnection line regions with a predetermined thickness, such that the conductive material bridges the largest interconnection line region out of the interconnection line regions at the upper side of the largest interconnection line region; and reflowing the conductive material to thereby fill the interconnection line regions by supplying a high pressure such that at least the void formed in the largest interconnection line region is filled.

28. A method according to claim 27, wherein said step of reflowing is followed by the step of planarizing the reflowed conductive material to remove conductive material overlying the surface of the insulation layer and thereby expose the insulation layer.

29. A method according to claim 27, wherein said step of forming the conductive material is performed by a Chemical Vapor Deposition(CVD) method.

30. A method according to claim 27, wherein said step of forming the conductive material is performed by sputtering method at room temperature or greater.

31. A method according to claim 27, wherein said step of reflowing comprises the step of reflowing at a temperature of approximately 400° C. or greater and at a pressure of approximately 600 MPa or greater.

32. A method according to claim 27, wherein the insulation layer is composed of at least two different insulation layers having different etch rates and at least one of a first insulation layer having a lower etch rate is formed on a second insulation layer having an higher etch rate than that of the first insulation layer, wherein said step of removing a portion of the insulation layer comprises a step of etching with an etchant to form the interconnection line regions and leave portions of the first insulation layer extending past the second insulation layer at upper portions of the interconnection line regions, overhanging the exposed upper portions of the interconnection line regions.

* * * * *

UNITED STATES PATENT AND TRADEMARK OFFICE
CERTIFICATE OF CORRECTION

PATENT NO. : 6,355,554 B1  Page 1 of 1
DATED : March 12, 2002
INVENTOR(S) : Choi et al.

It is certified that error appears in the above-identified patent and that said Letters Patent is hereby corrected as shown below:

<u>Title page,</u>
Item [57], ABSTRACT,
Line 22, following "extending" insert -- past --.

<u>Column 9,</u>
Line 25, please change "400☐" to -- 400º --.

<u>Column 11,</u>
Line 30, please change "400☐" to -- 400º --.

Signed and Sealed this

Twenty-fourth Day of September, 2002

*Attest:*

JAMES E. ROGAN
*Attesting Officer*  *Director of the United States Patent and Trademark Office*